(12) United States Patent
Im et al.

(10) Patent No.: US 8,709,837 B2
(45) Date of Patent: Apr. 29, 2014

(54) DEPOSITION APPARATUS AND METHOD FOR MANUFACTURING ORGANIC LIGHT EMITTING DIODE DISPLAY USING THE SAME

(71) Applicant: Samsung Display Co., Ltd., Yongin (KR)

(72) Inventors: Ja-Hyun Im, Yongin (KR); Kwan-Hee Lee, Yongin (KR); Ji-Hwan Yoon, Yongin (KR); Joong-Won Sim, Yongin (KR); Tae-Kwang Sung, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 0 days.

(21) Appl. No.: 13/666,768

(22) Filed: Nov. 1, 2012

(65) Prior Publication Data
US 2013/0323868 A1  Dec. 5, 2013

(30) Foreign Application Priority Data
May 31, 2012  (KR) .................. 10-2012-0058418

(51) Int. Cl.
*H01L 51/40*  (2006.01)
*H01L 21/67*  (2006.01)
*H01L 51/00*  (2006.01)

(52) U.S. Cl.
CPC .......... *H01L 21/6715* (2013.01); *H01L 51/001* (2013.01)
USPC .............. 438/22; 438/99; 438/478; 118/301; 118/723 VE; 427/421.1

(58) Field of Classification Search
USPC ......... 438/46, 22, 99, 478; 118/301, 723 VE; 427/421.1; 257/E21.024
See application file for complete search history.

(56) References Cited

U.S. PATENT DOCUMENTS

| 6,142,097 A * | 11/2000 | Tomofuji ................ 118/723 VE |
| 6,632,285 B2 * | 10/2003 | Wang et al. .................. 118/726 |
| 2002/0105688 A1 | 8/2002 | Katagami et al. |
| 2002/0145692 A1 | 10/2002 | Ohkouchi et al. |
| 2009/0186159 A1 * | 7/2009 | Mitchell et al. ............ 427/421.1 |
| 2010/0159122 A1 | 6/2010 | Hosoi et al. |
| 2012/0064663 A1 * | 3/2012 | Choi et al. ...................... 438/99 |

FOREIGN PATENT DOCUMENTS

| JP | 2007-227359 | 9/2007 |
| KR | 10-2006-0064879 | 6/2006 |
| KR | 10-2007-0051639 | 5/2007 |

* cited by examiner

*Primary Examiner* — Michael Trinh
(74) *Attorney, Agent, or Firm* — Robert E. Bushnell, Esq.

(57) ABSTRACT

A deposition apparatus includes: a deposition source including a spray nozzle linearly arranged in a first direction and discharging a deposition material; and a pair of angle control members disposed at both sides of the deposition source and controlling a discharging direction angle of the deposition material. Each angle control member includes a rotation axis parallel to the first direction, and a plurality of shielding plates installed about the rotation axis and separated from each other by a predetermined interval around the rotation axis. Although the deposition angle is changed according to the increasing of the process time, the deposition angle is compensated to form a uniform thin film. Also, the organic thin film may be uniformly deposited through each pixel of an organic light emitting diode (OLED) display, thereby increasing luminance uniformity for each pixel.

16 Claims, 3 Drawing Sheets

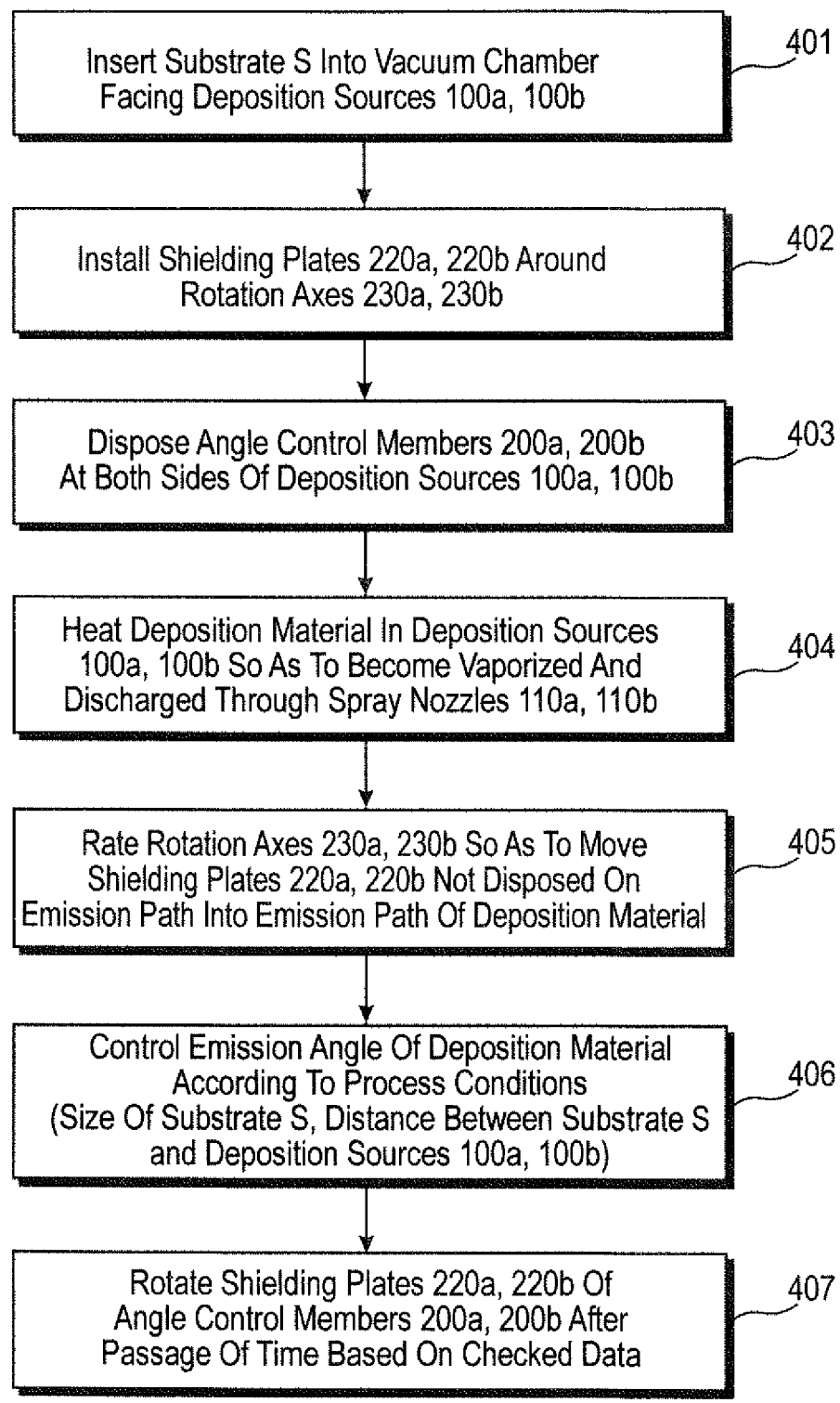

DEPOSITION APPARATUS AND METHOD FOR MANUFACTURING ORGANIC LIGHT EMITTING DIODE DISPLAY USING THE SAME

CLAIM OF PRIORITY

This application makes reference to, incorporates the same herein, and claims all benefits accruing under 35 U.S.C. §119 from an application earlier filed in the Korean Intellectual Property Office on the 31 of May 2012 and there duly assigned Serial No. 10-2012-0058418.

BACKGROUND OF THE INVENTION

1. Field of the Invention

The present invention relates to a deposition apparatus and a manufacturing method of an organic light emitting diode (OLED) display using the same, and more specifically, to a deposition apparatus for controlling an emission direction of a deposition material by an angle control member, and a manufacturing method of an organic light emitting diode (OLED) display using the same.

2. Description of the Related Art

Among display devices, an organic light emitting diode display having the advantages of a wide viewing angle, excellent contrast, and a fast response speed has been receiving attention as one of the next generation display elements.

In general, the organic light emitting diode display has a deposition structure wherein an emission layer is inserted between an anode and a cathode so that holes and electrons generated in the anode and the cathode are recombined in the emission layer for light emission, thereby realizing a color. However, in this structure, it is difficult to obtain high efficiency light emission so that a middle layer, such as an electron injection layer (EIL), an electron transport layer (ETL), a hole transport layer (HTL), and a hole injection layer (HIL), is selectively added and inserted between each electrode and the emission layer.

In the flat panel display, such as the organic light emitting diode (OLED) display, an organic material or metal used as the electrode employs a vacuum deposition method for depositing a corresponding material in a vacuum atmosphere and forming a thin film on a flat plate. In the vacuum deposition method, a substrate on which an organic thin film will be formed is positioned in a vacuum chamber, a fine metal mask (FMM) having the same pattern as a pattern to be formed, such as a thin film, is disposed closely thereon, and an organic material is evaporated or sublimated by using a deposition source unit to deposit it on the substrate.

In this vacuum deposition method, it is necessary to control a spray angle according to the characteristic of the deposition material and the pattern of the mask, and to control the spray angle so that it is not changed with the passage of time.

The above information disclosed in this Background section is only for enhancement of an understanding of the background of the invention, and therefore it may contain information that does not form the prior art that is already known in this country to a person of ordinary skill in the art.

SUMMARY OF THE INVENTION

The present invention relates to a deposition apparatus that uniformly forms a thin film by compensating for a deposition angle that is changed with the passage of time.

The present invention further relates to a manufacturing method of an organic light emitting diode (OLED) display that uniformly forms a thickness of a deposited thin film by controlling the angle of an angle control member so as to ensure a uniform deposition angle.

A deposition apparatus according to the present invention comprises: a deposition source including a spray nozzle linearly arranged in a first direction and discharging a deposition material; and a pair of angle control members disposed at both sides of the deposition source for controlling a discharging direction angle of the deposition material; wherein each angle control member includes a rotation axis parallel to the first direction, and a plurality of shielding plates installed relative to the rotation axis and disposed so as to be separated from each other by a predetermined interval around the rotation axis.

A plurality of shielding plates may be separately disposed while forming equivalent center angles.

The deposition apparatus may further include a rotation driver for rotating the rotation axis.

The deposition apparatus may further include a rotation controller for controlling the rotation driver so as to periodically rotate the shielding plate.

The deposition apparatus may further include a moving unit disposed on one side of each angle control member for controlling a distance between the angle control member and the deposition source.

A manufacturing method of an organic light emitting diode (OLED) display according to the present invention comprises: disposing a substrate so as to face a deposition source including a spray nozzle arranged in a first direction and discharging a deposition material; disposing a pair of angle control members respectively installed with a plurality of shielding plates around a rotation axis for controlling a discharging direction angle of the deposition material on both sides of the deposition source; discharging the deposition material onto the substrate so as to form a thin film on the substrate; and rotating the shielding plate of the angle control member.

The method may further include controlling a distance between the angle control member and the deposition source.

In the rotating of the shielding plate of the angle control member, the shielding plate may be periodically rotated with the passage of a predetermined period of time.

The deposition material may be an organic material forming an organic emission layer, and the thin film may be an organic emission layer.

According to exemplary embodiments of the present invention, a thin film having a desired thickness may be uniformly formed. Also, although the deposition angle is changed with an increase in the process time, the deposition angle is compensated so as to form a uniform thin film.

Also, the organic thin film may be uniformly deposited through each pixel of the organic light emitting diode (OLED) display, thereby increasing luminance uniformity for each pixel.

In addition, according to exemplary embodiments of the present invention, although the deposition material is attached to the angle control member so that the deposition angle of the deposition material is changed, the angle control member may be replaced without stopping the process so that the manufacturing yield may be improved. The manufacturing process is easy, a deposition apparatus may be easily applied to the manufacturing process of a large-sized substrate, and the manufacturing yield and the deposition efficiency may be improved.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIG. 4 is a flowchart showing a method of manufacturing an organic light emitting diode (OLED) display by using a deposition apparatus according to an exemplary embodiment of the present invention.

DETAILED DESCRIPTION OF THE INVENTION

Figure 1:
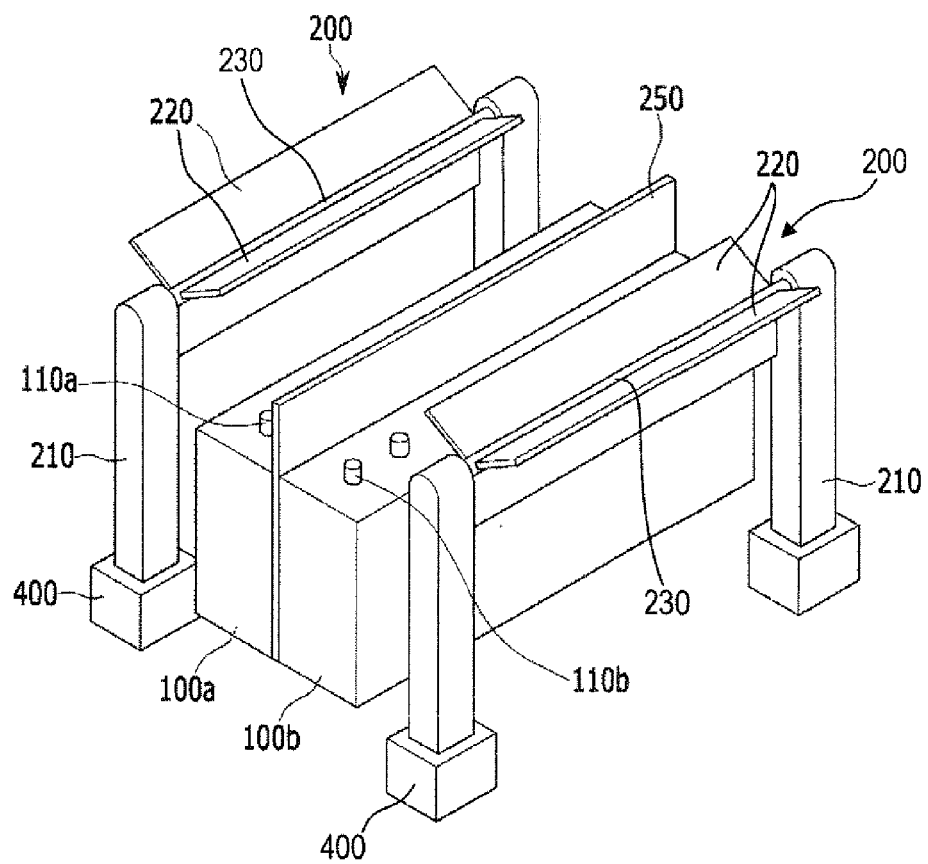
FIG. 1 is a perspective view of a deposition apparatus according to an exemplary embodiment of the present invention.

A deposition apparatus and a method for manufacturing an organic light emitting diode (OLED) display according to embodiments of the present invention will be described with reference to the accompanying drawings. However, the present invention is not limited to the exemplary embodiments disclosed herein, but may be implemented in various different forms. The exemplary embodiments herein merely complete the disclosure of the present invention and fully provide an explanation of the invention to the person of ordinary skill in the art. Like reference numerals refer to like elements throughout the specification.

In the drawings, the thickness of layers, films, panels, regions, etc., are exaggerated for clarity. In the drawings, for better understanding and ease of description, the thicknesses of some layers and areas are exaggerated. It will be understood that, when an element such as a layer, film, region, or substrate is referred to as being "on" another element, it can be directly on the other element or intervening elements may also be present.

In addition, unless explicitly described to the contrary, the word "comprise" and variations such as "comprises" or "comprising" will be understood to imply the inclusion of stated elements but not the exclusion of any other elements. Furthermore, throughout the specification, "on" implies being positioned above or below a target element, and does not imply being necessarily positioned on the top on the basis of a gravity direction.

Figure 2:
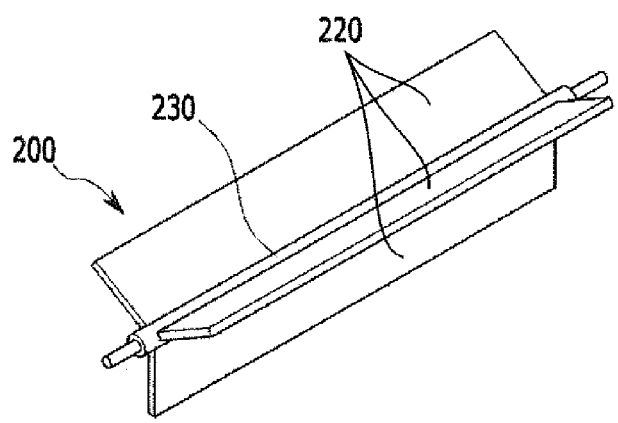
FIG. 2 is a perspective view of an angle control member of a deposition apparatus according to an exemplary embodiment of the present invention.

FIG. 1 is a perspective view of a deposition apparatus according to an exemplary embodiment of the present invention, and FIG. 2 is a perspective view of an angle control member of a deposition apparatus according to an exemplary embodiment of the present invention.

Referring to FIG. 1 and FIG. 2, a deposition apparatus according to an exemplary embodiment of the present invention includes deposition sources 100a and 100b and a pair of angle control members 200.

In each drawing, for better understanding and ease of description, although a chamber is not shown, all constituents of FIG. 1 are disposed in a vacuum chamber maintaining an appropriate vacuum degree. The deposition apparatus and a substrate S (shown in FIGS. 3A and 3B) formed with a thin film are disposed in the vacuum chamber. The substrate S faces, and is spaced apart from, the deposition apparatus, and the deposition apparatus and the substrate S may be relatively moved during deposition. When the substrate S is horizontally disposed, the deposition apparatus is spaced from and disposed under the substrate S, and a deposition material may be emitted upward, while when the substrate S is vertically disposed, the deposition apparatus is spaced from and disposed beside the substrate S in the horizontal direction and the deposition material maybe emitted in the horizontal direction. In an exemplary embodiment of the present invention, the deposition apparatus is disposed on a bottom surface of the vacuum chamber and the substrate S is horizontally disposed thereon, but the invention is not limited thereto, and the substrate S may be vertically disposed so that the deposition apparatus maybe disposed beside and spaced apart from the substrate in the horizontal direction.

The deposition sources 100a and 100b, as a means for emitting a deposition material to be deposited on the substrate S, include a space (not shown) for receiving the deposition material, such as an organic material, therein. The space for receiving the deposition material can be formed with a ceramic material such as alumina ($Al_2O_3$) or aluminum nitride (AlN) with excellent heat radiation, but the invention is not restricted thereto, and the space for receiving the deposition material can be formed with various materials with excellent heat radiation and thermal resistance. A heater (not shown), formed to be attached to and to surround an external side of the space for receiving the deposition material, can be provided on the external side thereof, and it heats and vaporizes the received deposition material. Spray nozzles 110a and 110b for spraying the deposition material that is vaporized or sublimated in the inner space of the deposition source are disposed on one side of the deposition sources 100a and 100b, respectively, facing the substrate S.

The substrate S on which the deposition material will be formed can be formed so as to be quadrangular, and the deposition sources 100a and 100b can be configured to be linear deposition sources in which the spray nozzles 110a and 110b, respectively, for discharging the deposition material are linearly arranged in correspondence to one side of the substrate S. As shown in FIG. 1, spray nozzles 110a and 110b can be disposed in one line, or the spray nozzles 110a and 110b can be disposed in multiple lines rather than being restricted to one line. Also, a plurality of deposition sources may be disposed in parallel, and in the present exemplary embodiment, the two deposition sources 100a and 100b may be disposed in parallel as an example.

The angle control members 200 are disposed as a pair at both sides of the deposition sources 100a and 100b, and are formed on the emission path of the deposition material discharged from the spray nozzles 110a and 110b of the deposition sources 100a and 100b, respectively, thereby performing a function of controlling the emission direction of the spray nozzles 110a and 110b. When the deposition sources 100a and 100b represent linear deposition sources elongated in a first direction as shown in FIG. 1, the angle control members 200 can be formed in a lengthwise direction of the linear deposition sources 100a and 100b, respectively, and can be disposed on the discharging path of the deposition material.

Each of the angle control members 200, disposed at both sides of the deposition sources 100a and 100b, includes a rotation axis 230 and a plurality of shielding plates 220. The rotation axis 230 as a bar member is elongated in the first direction and is disposed in a direction parallel to the first direction. The shielding plates 220, as a means for controlling the emission direction angle of the deposition material, are partially disposed on the emission path of the deposition material, and are formed in a plate shape extending according to the rotation axis 230. Multiple shielding plates 220 are provided, are disposed so as to be spaced apart from each other by an interval with respect to the rotation axis 230, and are rotated according to the rotation of the rotation axis 230. In the present exemplary embodiment of FIG. 2, three shielding plates 220 are provided for each angle control member 200, but the invention is not limited thereto.

The deposition material spayed from the spray nozzles 110a and 110b of the deposition sources 100a and 100b, respectively, in the deposition process maybe attached to the shielding plates 220 disposed on the emission path of the deposition material, but if the deposition material attached to the shielding plates 220 is increased with the passage of time, the angle at which the deposition material is discharged may be changed. When providing a plurality of shielding plates 220, the shielding plates 220 may be rotated and used after the passage of time so that it is not necessary to replace the shielding plates 220, and the usage time may be increased, rather than a case in which one shielding plate is provided.

A plurality of shielding plates 220 are separately disposed while forming equivalent angles toward the center. For example, as shown in FIG. 2, in the case of three shielding plates 220, the shielding plates 220 are separately disposed while forming an angle of 120 degrees.

A pair of supporters 210 of a bar shape for supporting both ends of the rotation axis 230 are formed, and the supporter 210 supports the rotation axis 230 so as to be disposed in the first direction as the length direction of the deposition sources 100a and 100b. The rotation axis 230 may be rotated by a rotation driver (not shown) providing power, and the rotation driver is connected to the rotation axis 230 installed at both sides of the rotation axis 230 or may be disposed inside the supporter 210. A rotation controller (not shown) may control the rotation driver for the shielding plate 230 so as to be periodically rotated after the passage of a predetermined period of time. When a plurality of deposition sources 100a and 100b are disposed in parallel, an angle control member 250 of a plate shape is disposed between the deposition sources 100a and 100b, and may control the emission angle of the deposition material discharged from each deposition source.

Moving units 400 disposed at one side of each angle control member 200 and controlling a distance between the angle control member 200 and the deposition sources 100a and 100b may be further included. That is, the moving units 400 may control angle control members 200 disposed at both sides of the deposition sources 100a and 100b so as to be closer to or further from the deposition sources 100a and 100b. A detailed description thereof will be provided later with reference to FIG. 3A and FIG. 3B.

Next, an operation of the deposition apparatus and a manufacturing method of an organic light emitting diode (OLED) display according to an exemplary embodiment of the present invention will be described with reference to the accompanying drawings.

Figure 3A:
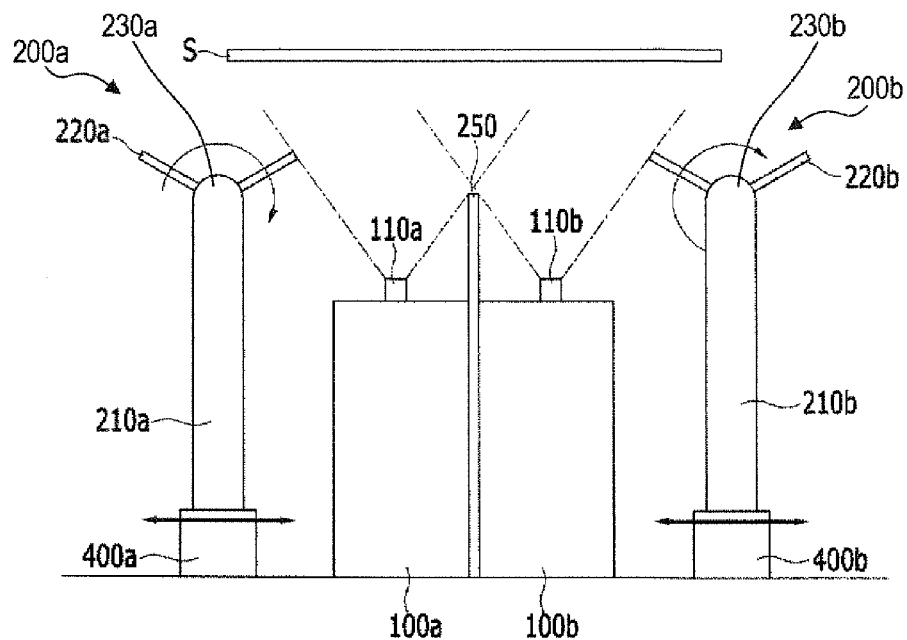
FIG. 3A and FIG. 3B are schematic diagrams showing a method of manufacturing an organic light emitting diode (OLED) display by using a deposition apparatus according to an exemplary embodiment of the present invention.
Figure 3B:
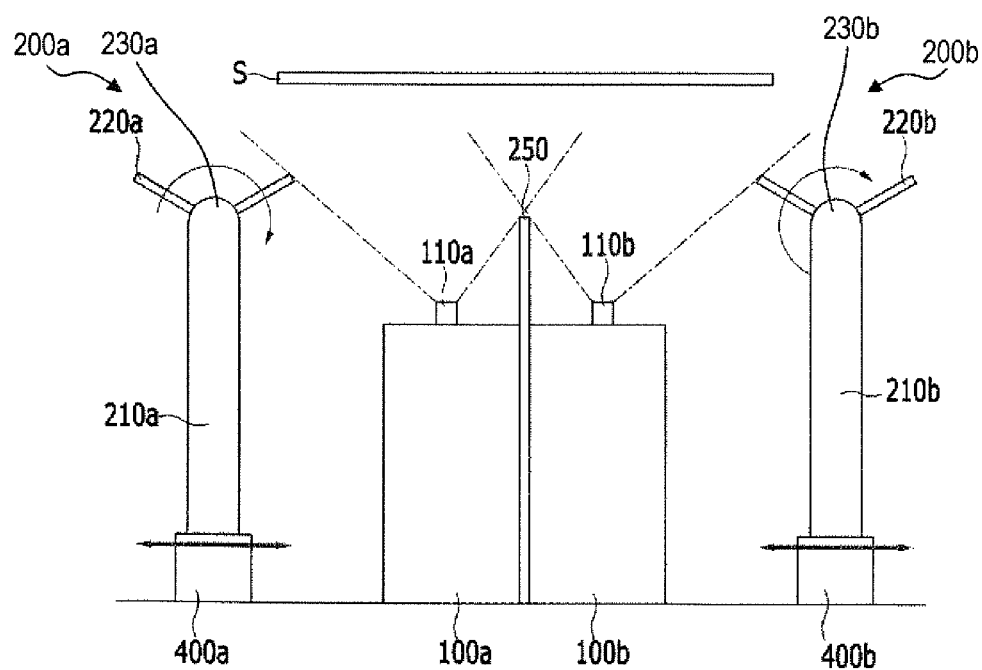

FIG. 3A and FIG. 3B are schematic diagrams, and FIG. 4 is a flowchart, showing a method of manufacturing an organic light emitting diode (OLED) display by using a deposition apparatus according to an exemplary embodiment of the present invention.

First, a substrate S is inserted into a vacuum chamber (not shown), and is then disposed so as to face the deposition sources 100a and 100b discharging the deposition material (FIG. 4, block 401). Also, a plurality of shielding plates 220a and 220b are installed around the rotation axes 230a and 230b (FIG. 4, block 402), and a pair of angle control members 200a and 200b for controlling the emission direction angle of the deposition material are respectively disposed at both sides of the deposition sources 100a and 100b (FIG. 4, block 403).

The deposition material received inside the deposition sources 100a and 100b is heated so as to be vaporized, and as shown in FIGS. 3A and 3B, the deposition material is discharged through the spray nozzles 110a and 110b (FIG. 4, block 404). The discharged deposition material reaches the substrate S so as to form a thin film thereon.

While the deposition material is discharged onto the substrate S so as to form a thin film, the deposition material is deposited on both the substrate S and the angle control members 200a and 200b provided on the path on which the deposition material is discharged. When the deposition material is attached to a part of the angle control members 200a and 200b that is provided on the path on which the deposition material is discharged and is then solidified, the angle for discharging the deposition material can be changed. At this point, the rotation axes 230a and 230b are rotated so as to move other shielding plates 220a and 220b that are not disposed on the emission path of the deposition material into the emission path of the deposition material (FIG. 4, block 405). For example, when three shielding plates 220 (as seen in FIGS. 3A and 3B) are disposed while forming the center angles so as to be equivalent, the rotation axis 230 is rotated by 120 degrees after the passage of a predetermined time period. As described above, if the rotation axis 230 of FIG. 2 is rotated, the shielding plate 220 is at the same position that is initially predetermined so that the deposition process may be continuously performed. That is, although the deposition material is attached to the shielding plate 220, the usage time of the shielding plate 220 may be increased without stopping the deposition process and replacing the shielding plate 220.

Referring to FIGS. 3A and 3B, it is necessary to control the emission angle of the deposition material according to process conditions, such as the size of the substrate S and the distance between the substrate S and the deposition sources 100a and 100b (FIG. 4, block 406). For this purpose, the rotation angle of the shielding plates 220a and 220b of the angle control members 200a and 200b, and the distance between the angle control members 200a and 200b and the deposition sources 100a and 100b, may be controlled. As shown in FIG. 3A, when the angle control members 200a and 200b of both sides of the deposition sources 100a and 100b become closer to the deposition sources 100a and 100b, the emission angle of the deposition material may be decreased. In contrast, as shown in FIG. 3B, when the angle control members 200a and 200b of both sides of the deposition sources 100a and 100b are moved so as to be further from the deposition sources 100a and 100b, the emission angle of the deposition material may be increased.

Also, through a simulation process, the amount of the deposition material that is attached to the angle control members 200a and 200b depending on the process conditions including the process time and the deposition material, and the control of the discharging angle of the deposition material according to the passage of the process time, may be checked, and at this point, the shielding plates 220a and 220b of the angle control members 200a and 200b may be rotated after the passage of the predetermined time through the checked data (FIG. 4, block 407).

For example, when the deposition material is deposited on the substrate S so as to form the thin film, if the deposition material attached to the angle control members 200a and 200b is increased by an amount that changes the emission angle after the process time has passed, the shielding plates 220a and 220b of the angle control members 200a and 200b is controlled so as to be rotated by the predetermined angle.

The deposition material desirably includes an organic material for forming an organic emission layer, that is, subpixels for displaying red (R), green (G), and blue (B) in the organic light emitting diode (OLED) display.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A deposition apparatus, comprising:
    a deposition source including a spray nozzle linearly arranged in a first direction and discharging a deposition material; and
    a pair of angle control members disposed at both sides of the deposition source and controlling a discharging direction angle of the deposition material;
    each angle control member including:
    a rotation axis parallel to the first direction; and
    a plurality of shielding plates installed around the rotation axis and separated from each other by a predetermined interval around the rotation axis.

2. The deposition apparatus of claim 1, further comprising a plurality of shielding plates separately disposed while forming equivalent center angles.

3. The deposition apparatus of claim 1, further comprising a rotation driver rotating the rotation axis.

4. The deposition apparatus of claim 3, further comprising a rotation controller controlling the rotation driver to periodically rotate the shielding plates.

5. The deposition apparatus of claim 4, the rotation controller controlling the rotation driver to rotate the shielding plates based on monitoring of at least one of an amount of the deposition material attached to the angle control members and a discharging angle of the deposition material.

6. The deposition apparatus of claim 1, the angle control members controlling the discharging direction angle of the deposition material based on at least one of a size of the substrate and a distance between the substrate and the deposition source.

7. The deposition apparatus of claim 1, further comprising a moving unit disposed on one side of each angle control member and controlling a distance between the angle control members and the deposition source.

8. A method of manufacturing an organic light emitting diode (OLED) display, comprising the steps of:
    disposing a substrate so as to face a deposition source, said deposition source including a spray nozzle arranged in a first direction and discharging a deposition material;
    providing a pair of angle control members, each angle control member being disposed on a respective side of the deposition source, and said each angle control member including a plurality of shielding plates disposed around a rotation axis and controlling a discharging direction angle of the deposition material on both sides of the deposition source;
    discharging the deposition material onto the substrate so as to form a thin film on the substrate; and
    rotating the shielding plates of the angle control member.

9. The method of claim 8, further comprising the step of controlling a distance between the angle control member and the deposition source.

10. The method of claim 8, the shielding plates of the angle control members being periodically rotated with each passage of a predetermined time period.

11. The method of claim 8, the deposition material comprising an organic material forming an organic emission layer, and the thin film being an organic emission layer.

12. The method of claim 8, the discharging step comprising heating the deposition material in the deposition source so as to discharge the deposition material onto the substrate.

13. The method of claim 8, the rotating step comprising rotating rotation axes to move shielding plates not disposed on an emission path of the deposition material into the emission path of the deposition material.

14. The method of claim 8, further comprising the step of controlling the discharging direction angle of the deposition material according to at least one of a size of the substrate and a distance between the substrate and the deposition source.

15. The method of claim 8, further comprising the step of monitoring at least one of an amount of the deposition material attached to the angle control members and a discharging angle of the deposition material.

16. The method of claim 15, the shielding plates of the angle control members being rotated based on the monitoring of said at least one of the amount of the deposition material attached to the angle control members and the discharging angle of the deposition material.

* * * * *